United States Patent
Mora-Puchalt (10) Patent No.: US 9,621,120 B2
(45) Date of Patent: Apr. 11, 2017

(54) APPARATUS AND METHOD FOR PRECHARGING A LOAD

(71) Applicant: Analog Devices Global, Hamilton (BM)

(72) Inventor: Gerard Mora-Puchalt, Catarroja (ES)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/818,126

(22) Filed: Aug. 4, 2015

(65) Prior Publication Data

US 2017/0040959 A1 Feb. 9, 2017

(51) Int. Cl.
H03F 1/02 (2006.01)
H03F 3/217 (2006.01)
H03M 1/12 (2006.01)

(52) U.S. Cl.
CPC ......... H03F 3/2175 (2013.01); H03F 1/0205 (2013.01); H03F 3/2171 (2013.01); H03M 1/12 (2013.01); H03F 2200/297 (2013.01)

(58) Field of Classification Search
CPC ..... H03F 1/02; H03F 2200/252; H03F 1/0205
USPC ................... 330/9, 292; 327/124
See application file for complete search history.

(56) References Cited

U.S. PATENT DOCUMENTS

| 4,808,942 | A | 2/1989 | Milkovic |
| 5,479,130 | A | 12/1995 | McCartney |
| 5,841,310 | A | 11/1998 | Kalthoff et al. |
| 6,191,648 | B1 * | 2/2001 | Lewicki ............... H03H 19/004 327/337 |
| 6,380,801 | B1 | 4/2002 | McCartney |
| 6,665,215 | B2 | 12/2003 | Thomas et al. |
| 6,717,468 | B1 | 4/2004 | Jeong et al. |
| 7,321,261 | B2 | 1/2008 | Felder |
| 7,609,112 | B2 | 10/2009 | Muller et al. |
| 7,642,846 | B2 | 1/2010 | Yan |
| 8,139,792 | B2 | 3/2012 | Magrath |
| 8,330,537 | B1 | 12/2012 | Ghorpade et al. |
| 8,493,139 | B2 | 7/2013 | Sayuk |
| 8,576,002 | B2 | 11/2013 | Rajasekhar |

(Continued)

OTHER PUBLICATIONS

"Chopper Stabilized (Auto-Zero) Precision Op Amps"; Analog Devices MT-055 Tutorial, Rev. 0, Oct. 2008, WK; pp. 1-6; Copyright 2009.

(Continued)

Primary Examiner — Steven J Mottola
(74) Attorney, Agent, or Firm — Knobbe, Martens, Olson & Bear LLP (57) ABSTRACT

An output stage of a buffer or an amplifier connected to a switched capacitive load can operate in two phases to perform precharging and fine settling. The precharging and fine settling phases can be synchronized to the switching phases of the switched capacitive load connected to the amplifier. During the precharging phase, the output stage can be disconnected from the prior stages of the amplifier, and the output node of the amplifier can be connected to the switched capacitive load to precharge the capacitive load with the voltage already stored in the output stage. During the fine settling phase, the output stage can be reconnected to the prior stages of the amplifier, and the amplifier nodes can settle and get ready for sampling, which can occur at the end of the fine settling phase.

15 Claims, 11 Drawing Sheets

(56) References Cited

U.S. PATENT DOCUMENTS

| | | |
|---|---|---|
| 8,624,668 B2 | 1/2014 | Wan et al. |
| 2010/0045378 A1 | 2/2010 | Steele |
| 2014/0184331 A1 | 7/2014 | Thomsen et al. |

OTHER PUBLICATIONS

Reza Moghimi, "Ask the Applications Engineer-39 Zero-Drift Operational Amplifiers"; Analog Dialogue 44-03 Back Burner, Mar. 2010 pp. 1-2.

* cited by examiner

APPARATUS AND METHOD FOR PRECHARGING A LOAD

CROSS-REFERENCE TO RELATED APPLICATION

This application is related to copending application titled APPARATUS AND SYSTEM FOR RAIL-TO-RAIL AMPLIFIER, Ser. No. 14/618,899, filed on Feb. 10, 2015, the disclosure of which is hereby incorporated by reference in its entirety herein.

BACKGROUND

Field

The described technology generally relates to electronics, and more specifically, to precharging a load.

Description of the Related Art

An amplifier that is intended to drive a switched capacitive load such as the input capacitor of a sigma-delta type of analog-to-digital convertor (ADC) or a successive approximation register (SAR) type of ADC should have accuracy in output voltage over the full range of input voltage and output voltage while preserving bandwidth large enough to deliver the output voltage in the allocated sampling period. To aid in achieving a relatively low input offset voltage, certain amplifiers can use autozeroing and/or chopping schemes, and often a ping-pong scheme or an auxiliary amplifier is used to perform precharging the capacitive load while the main amplifier is being autozeroed.

SUMMARY

Each of the methods and devices of the described technology has several aspects, no single one of which is solely responsible for its desirable attributes.

In one embodiment, an apparatus includes an output stage, at least one compensation capacitor, and one or more output stage switches configured to connect or disconnect at least part the output stage from an earlier stage of the amplifier, wherein the earlier stage is earlier in a signal path than the output stage. The output stage includes a first transistor, a second transistor, a first output node connected to the first and second transistors, and the at least part of the output stage is configured to precharge at least one switched capacitive load substantially during the at least part of the output stage is disconnected from the earlier stage.

In another embodiment, a method of precharging at least one switched capacitive load connected to at least one output of an amplifier is disclosed. The method includes disconnecting at least part of an output stage of the amplifier from an earlier stage of the amplifier for a first precharging duration within a first switch phase of the at least one switched capacitive load. The method further includes connecting an output node of the amplifier to the at least one switched capacitive load for the duration of the first switch phase of the at least one switched capacitive load. The method further includes reconnecting the output stage of the amplifier to the earlier stage of the amplifier for a first fine settling duration after the first precharging duration, wherein the output stage comprises a first transistor and a second transistor and is compensated with at least one capacitor.

BRIEF DESCRIPTION OF THE DRAWINGS

These drawings and the associated description herein are provided to illustrate specific embodiments of the described technology and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An output stage of a buffer or an amplifier connected to a switched capacitive load can operate in two phases to perform precharging and fine settling. The precharging and fine settling phases can be synchronized to the switching phases of the switched capacitive load connected to the amplifier. During the precharging phase, the output stage can be disconnected from the prior stage(s) of the amplifier, and the output node of the amplifier can be connected to the capacitive load to precharge the capacitive load with the voltage stored in the output stage. During the fine settling phase, the output stage can be reconnected to the prior stage(s) of the amplifier, and the amplifier nodes can settle and get ready for sampling, which can occur at the end of the fine settling phase.

Figure 1A:
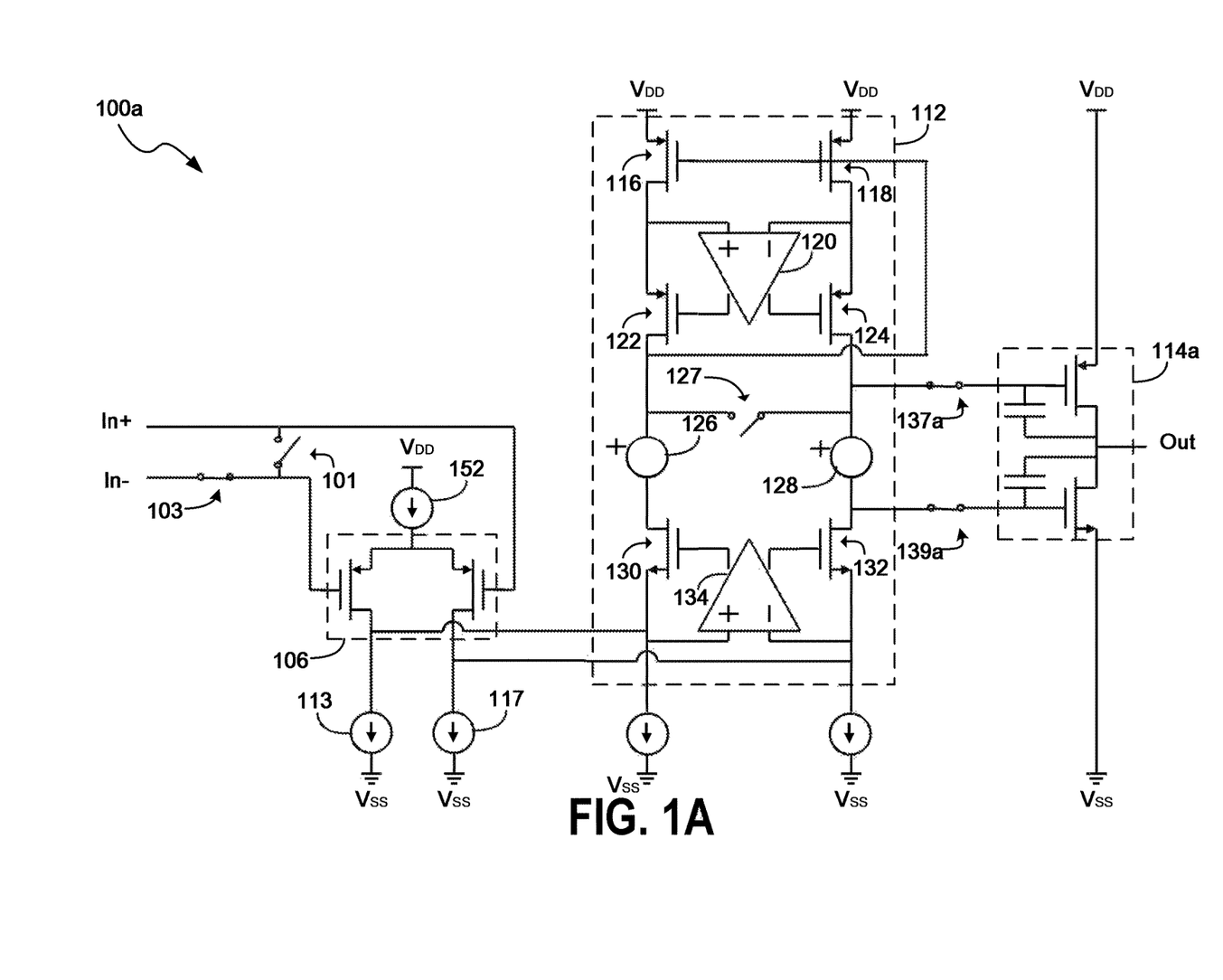
FIG. 1A is a schematic diagram illustrating an example amplifier in accordance with one embodiment.

FIG. 1A is a schematic diagram illustrating an example amplifier 100a in accordance with one embodiment. The illustrated amplifier 100a includes input switches 101, 103, an input differential pair 106, biasing current sources 113, 117, an amplifier stage 112, output switches 137a, 139a, and an output stage 114a. The amplifier stage 112 may include transistors 116, 118, 122, 124, 130, 132 and amplifiers 120, 134 that may form a folded cascode amplifier. The amplifier stage 112 may further include a first precharge phase switch 127 and floating voltage sources 126, 128. A non-inverting input In+ and an inverting input In− of the amplifier circuit 100a can be provided as inputs to the input differential pair 106.

In some embodiments, the amplifier 100a may further include another input differential pair (e.g., 104 in FIGS. 1D-1E below) complementary to the input differential pair 106. In such embodiments, the presence of the two complementary input differential pairs may permit the rail-to-rail operation of input signals at the input nodes In+, In−. In such embodiments, selection of the input differential pairs can be continuous using a transconductance stabilizer (e.g., 140 in FIGS. 1D-1E below) or discrete using a comparator (not shown). In embodiments implementing continuous differential pair selections, a transconductance stabilizer can boost tail current to keep constant total transconductance ($g_m$) over the full input range (e.g., boosting the current through the input differential pair tail current sources 150, 152 (FIGS. 1D-1E)). In some embodiments, the input switches 101, 103 (FIGS. 1A, 1C) may be implemented with one or more choppers (e.g., 102 in FIGS. 1D-1E below) each comprising one or more switches to perform chopping of the non-inverting and inverting inputs. In some embodiments, the output switches 137a, 139a may be implemented with one or more choppers (e.g., 136, 138 in FIGS. 1D-1E below) each comprising one or more switches to perform chopping between the amplifier stage 112 and the output stage 114a. The amplifier 100a can be configured as a unity-gain amplifier, in which case, the output node Out is tied to the inverting input node In−. For example, such unity-gain amplifiers can be useful to drive inputs of sigma-delta type or SAR type of ADCs. The floating voltage sources 126, 128 may be configured to bias complementary transistors differently and can be implemented with, for example, a Monticelli circuit or any other appropriate circuit as determined by a person of ordinary skill in the art.

Figure 1B:
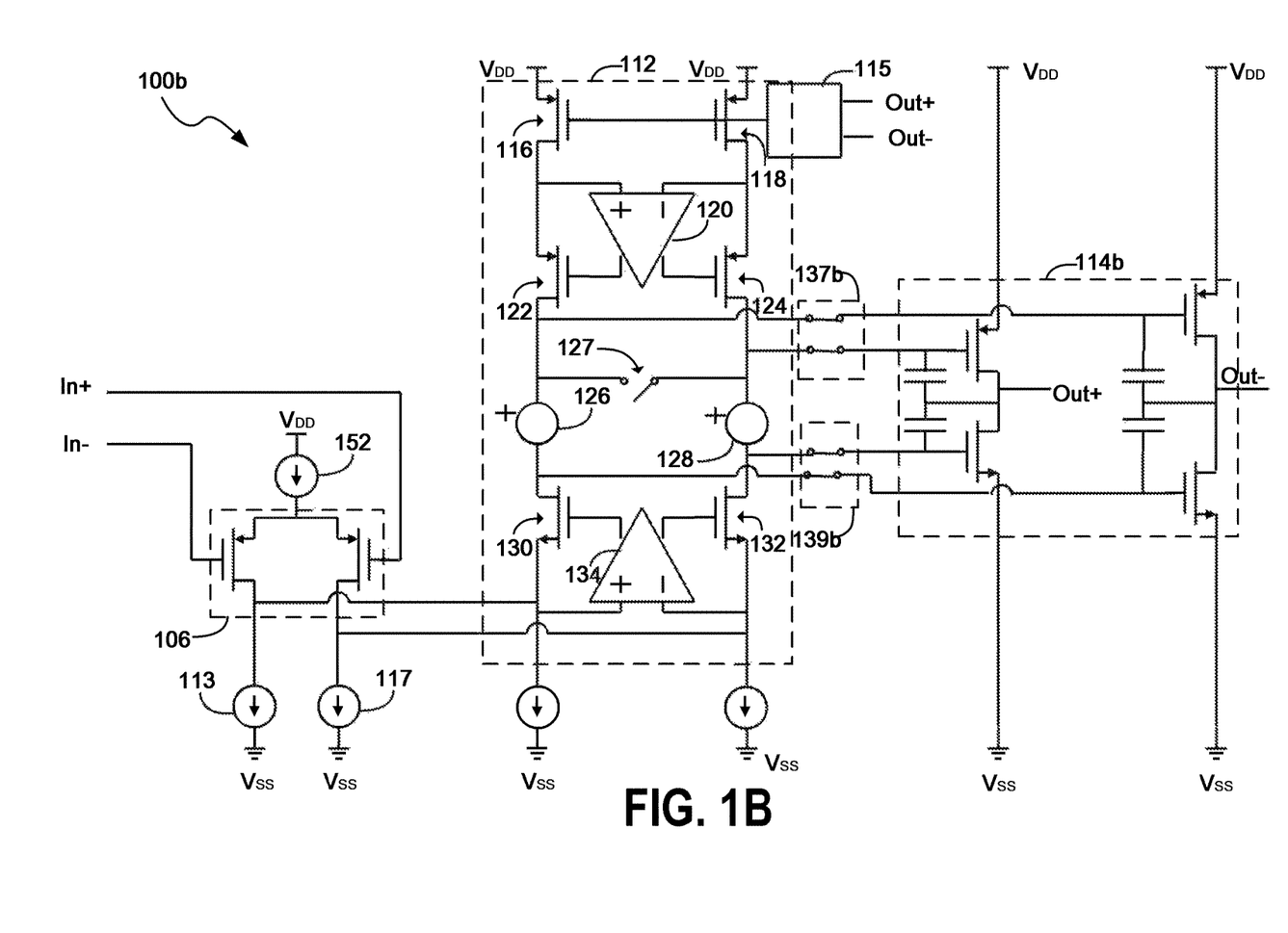
FIG. 1B is a schematic diagram illustrating an example amplifier in accordance with another embodiment.

FIG. 1B is a schematic diagram illustrating another an amplifier in accordance with another embodiment. The illustrated amplifier 100b implements a differential amplifier having differential outputs. The illustrated amplifier 100b includes some of the same features discussed in connection with FIG. 1A above as indicated with the same numberings. The amplifier 100b also includes a common mode feedback (CMFB) circuit 115, instead of a direct feedback from the transistor 122 to the transistors 116 and 118, and an output stage 114b having differential output nodes Out+ and Out−. The CMFB circuit 115 may be implemented with, for example, a resistor-averaged common mode circuit having a differential amplifier. The CMFB circuit 115 receives signals from the differential output nodes Out+, Out− from the output stage 114b as inputs, determines a common-mode voltage of those signals, and adjusts the biasing of the transistors 116, 118 of the amplifier stage 112 to adjust the common-mode voltage at the differential output nodes Out+, Out−.

Figure 1C:
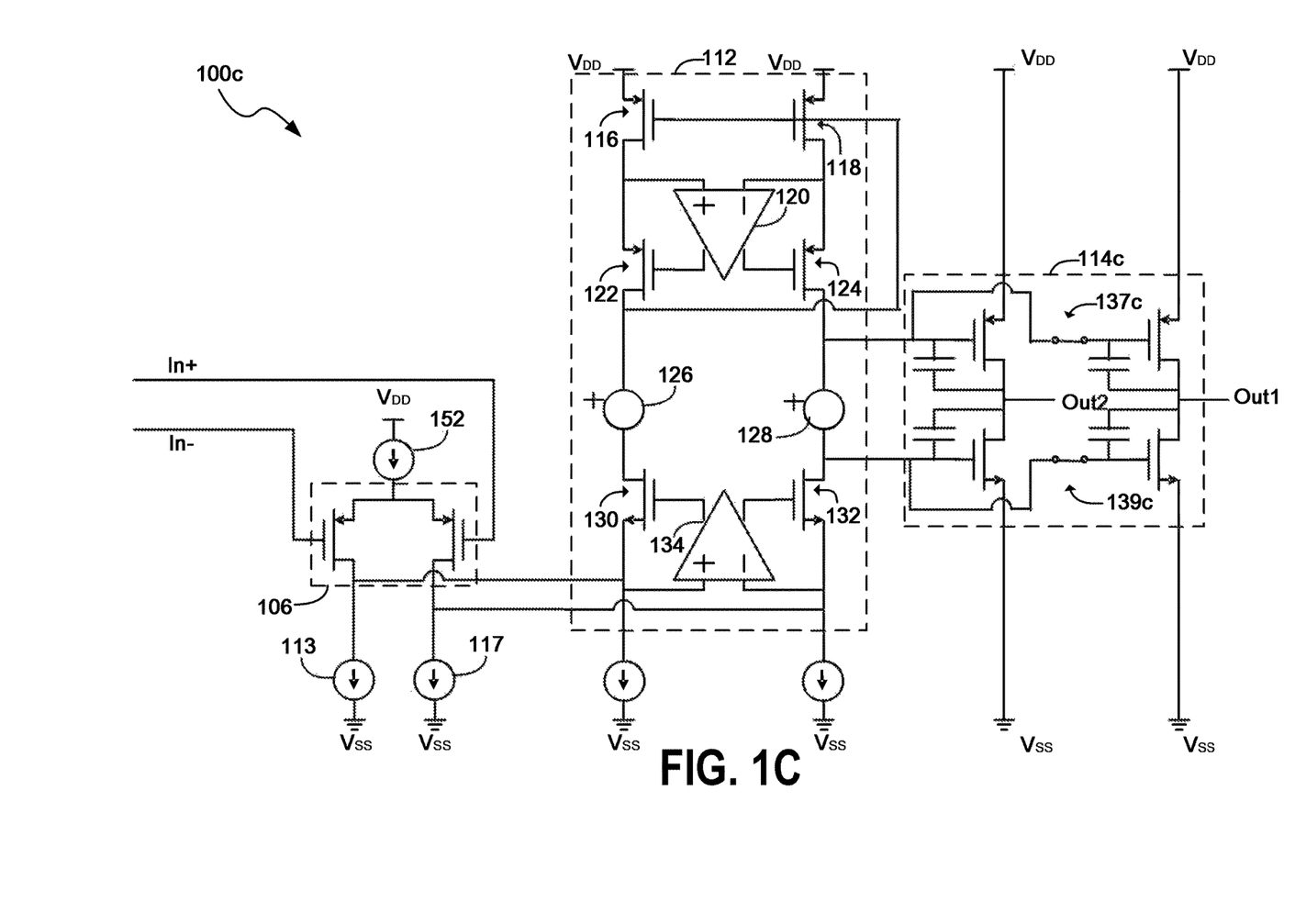
FIG. 1C is a schematic diagram illustrating an example amplifier in accordance with another embodiment.

FIG. 1C is a schematic diagram illustrating an example amplifier in accordance with another embodiment. The illustrated amplifier 100c has split outputs Out1, Out2. In this example, one of the split outputs (e.g., Out2) can be connected to the inverting input In− all the time while the other split output (e.g., Out1) can be periodically connected to and disconnected from the inverting input In− so that only part of the output stage 114c is used to precharge the capacitive load input(s) of the switching or sampling circuit (e.g., sigma-delta or SAR ADC) following the amplifier 100c. The illustrated amplifier 100c includes some of the same features discussed in connection with FIGS. 1A-1B above as indicated with the same numberings. The amplifier 100c includes output switches 137c, 139c connected to only one branch of the output stage 114c, and the other branch of the output stage 114c is connected to the inverting input to the input differential pair 106 without intermediate switches. In some embodiments, the fully differential feature of the amplifier 100b (FIG. 1B) and the split output feature of the amplifier 100c (FIG. 1C) can be combined to implement fully differential split outputs (not shown) so that some differential output pairs can be always connected to the earlier stage while other differential output pairs can be connected to and disconnected from the earlier stage through the output switches 137, 139. In this embodiment, some of the differential output pairs can be configured to precharge a plurality of capacitive loads respectively connected to those differential output pairs, and all the differential output pairs can be configured to perform fine settling.

Figure 1D:
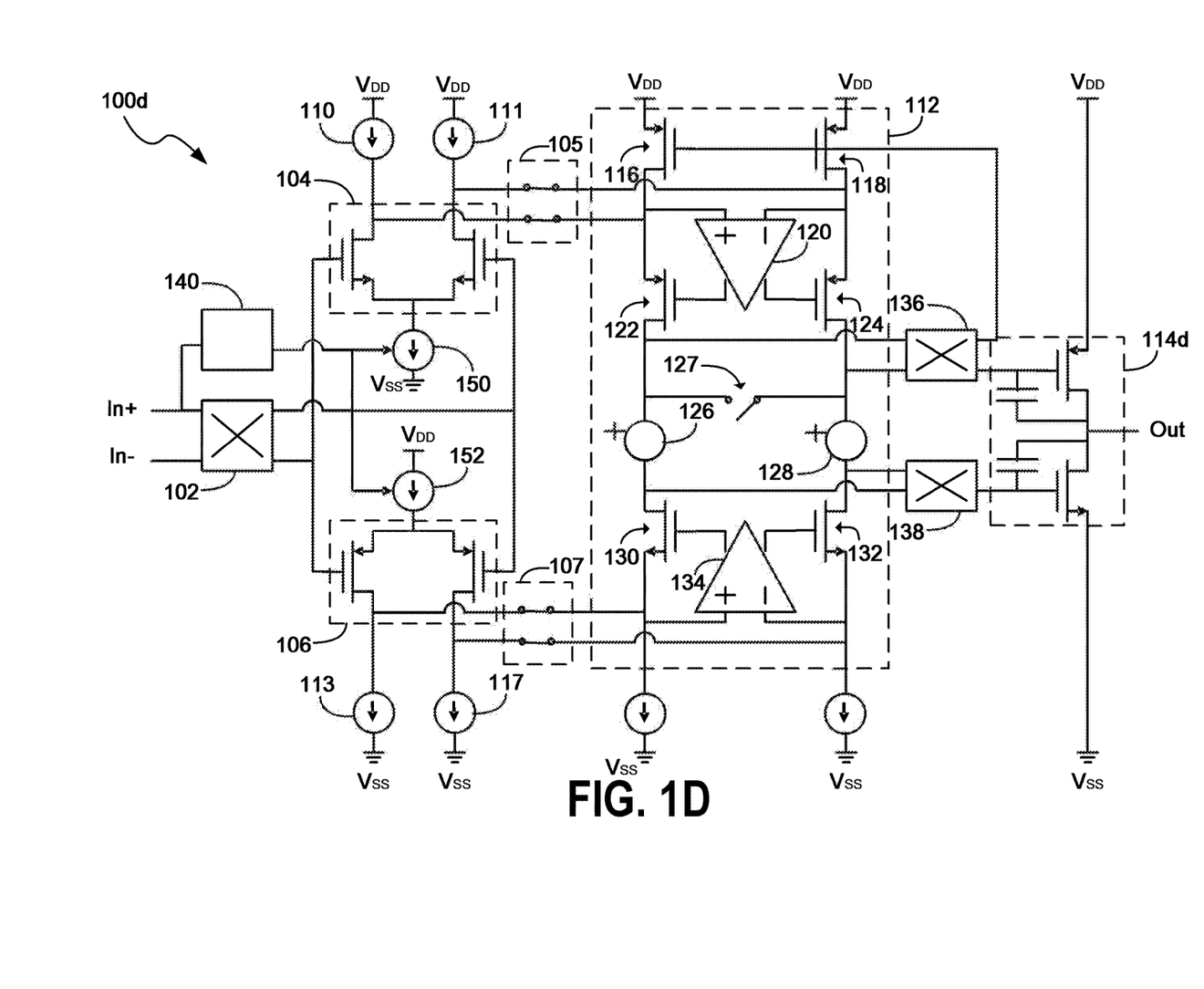
FIG. 1D is a schematic diagram illustrating an example amplifier in accordance with another embodiment.

FIG. 1D is a schematic diagram illustrating an example amplifier in accordance with another embodiment. The illustrated amplifier 100d implements an amplifier with differential inputs. The illustrated amplifier 100d includes some of the same features discussed in connection with FIGS. 1A-1C above as indicated with the same numberings. The amplifier 100d includes an input differential pair 104, which can be complementary to the input differential pair 106. The amplifier 100d further includes biasing current sources 110, 111 and an input differential pair tail current source 150 for the input differential pair 104. The amplifier 100d also includes a transconductance stabilizer 140, an input chopper 102, interstage switches 105, 107, and output choppers 136, 138.

The presence of the two complementary input pairs 104, 106 permits the rail-to-rail operation of input signals at the input nodes In+, In−. When, for example, the input signals are relatively high in voltage (near the positive rail $V_{DD}$), the N-type differential pair 104 is used. When the input signals are relatively low in voltage (near the negative or ground rail $V_{SS}$), the P-type differential pair 106 is used. The switching between the complementary input pairs 104, 106 can be performed in a discrete manner using the interstage switches 105, 107 or in a gradual manner with proper biasing.

Figure 1E:
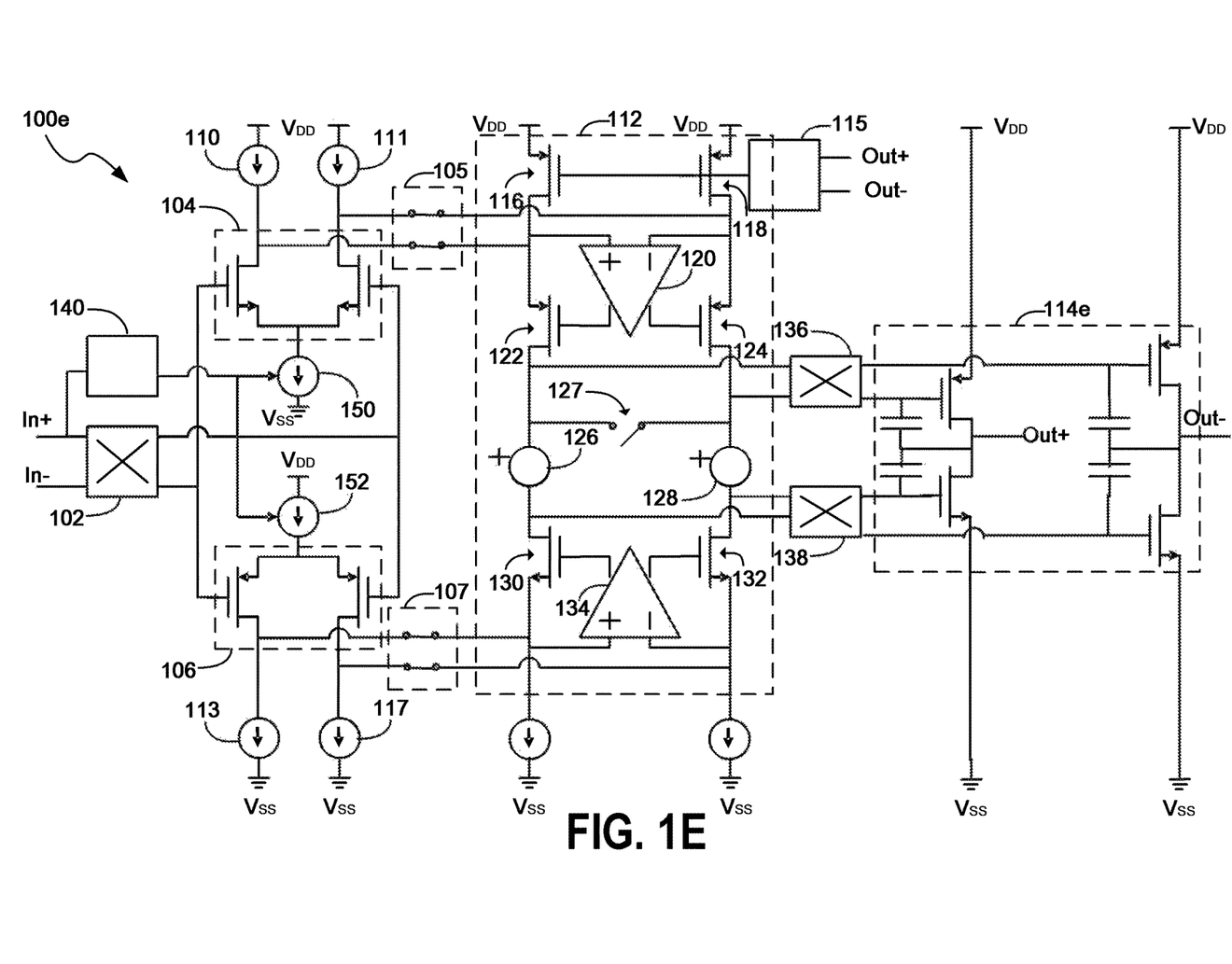
FIG. 1E is a schematic diagram illustrating an example amplifier in accordance with another embodiment.

FIG. 1E is a schematic diagram illustrating an example amplifier in accordance with another embodiment. The illustrated amplifier 100e implements a fully differential amplifier having differential inputs and differential outputs. The illustrated amplifier 100e includes some of the same features discussed in connection with FIG. 1E above as indicated with the same numberings.

In some embodiments, one or both of the non-inverting and the inverting inputs (e.g., In+, In− of FIGS. 1D-1E) may further be provided as inputs to a comparator (not shown), which is coupled to the interstage switches 105, 107 to select either one of the input differential pairs 104, 106 based on input voltage levels compared to a threshold voltage, for example, $(V_{DD}-V_{SS})/2$ or $V_{DD}/2$ when $V_{SS}$ is ground. In such an embodiment, a discrete input pair selection may be performed, and only one of the input differential pairs 104, 106 will typically be electrically connected to the amplifier stage 112 at a time for a chop period, for example, as only one of the interstage switches 105, 107 will typically be closed at a time for sampling during that chop period. A discrete input pair selection may minimize the residual error after chopping the amplifier offset. Embodiments that implement discrete input pair selection may not need to have the transconductance stabilizer 140 illustrated in FIGS. 1D-1E.

In other embodiments, both of the input differential pairs 104, 106 (FIGS. 1D-1E) may remain electrically connected to the amplifier stage 112 regardless of input voltage. In such an embodiment, a continuous input pair selection may be performed. In the embodiment implementing a continuous input pair selection, the transition between using the two differential input pairs 104, 106 may happen gradually, which may avoid discontinuities or glitches at the transition point. Embodiments that implement continuous input pair selection may use the transconductance stabilizer 140 illustrated in FIGS. 1D-1E. The transconductance stabilizer 140 may be configured to boost one input differential pair tail current source (e.g., 150) when the other input differential pair tail current source (e.g., 152) is squeezed when the input voltage is too close to a rail voltage, for example. An example implementation of the transconductance stabilizer 140 for the N-type input differential pair 104 is further described in connection with FIG. 5 below.

In some embodiments, instead of or in conjunction with the biasing current sources 110, 111, 113, 117, autozero circuits (not shown) can be configured to autozero inputs to the input differential pairs 104, 106 so that the amplifier 100a-100e can accept and function over the full range of inputs. In embodiments including complementary input differential pairs 104, 106 (FIGS. 1D-1E), their respective biasing circuits can be implemented with devices that are complementary to each other.

The illustrated amplifiers 100a-100e (FIGS. 1A-1E) can be connected to one or more switched capacitive loads at their outputs (e.g., Out, Out+, Out−) and may function in multiple phases. In some embodiments, the one or more switched capacitive loads can be an input capacitor of a sigma-delta modulator or a SAR ADC. The amplifiers 100a-e may have a precharging phase 402 (FIGS. 4A-4C) followed by a fine settling phase 404 (FIGS. 4A-4C), and each sampling point fs (FIGS. 4A-4C) may occur at the end of the fine settling phase 404 and can be immediately followed by another precharging phase. In some embodiments, after the fine settling phase 404 (e.g., 404 in FIG. 4A), there may be an idle period during which the switched capacitive load may be disconnected from the amplifier. In some embodiments, the precharging phase 402 and the fine settling phase 404 can be synchronized to switching or sampling phases controlled by the p1, p2 signals (FIGS. 4A-4C) to the load switches (e.g., 232, 237, 238, 239 of FIGS. 2A-3B) of one or more switched capacitive loads (e.g., 230, 235 of FIGS. 2A-3B) the output stages 114a-e are connected to and configured to precharge as disclosed herein. Further details of the different operational phases are described in connection with FIGS. 2A-4C below.

In one embodiment, the devices illustrated in FIGS. 1A-3B may be implemented with metal oxide semiconductor (MOS) devices, such as NMOS devices or PMOS devices. While the terms "metal" and "oxide" may be present in, for example, a MOSFET, MOS transistors can have gates made out of materials other than metals, such as polysilicon, and have dielectric oxide regions made from dielectrics other than silicon oxide, such as a high-k dielectric. In another embodiment, the devices illustrated in FIGS. 1A-3B may be implemented with other devices on silicon, compound semiconductor, or any other suitable semiconductor.

Figure 2A:
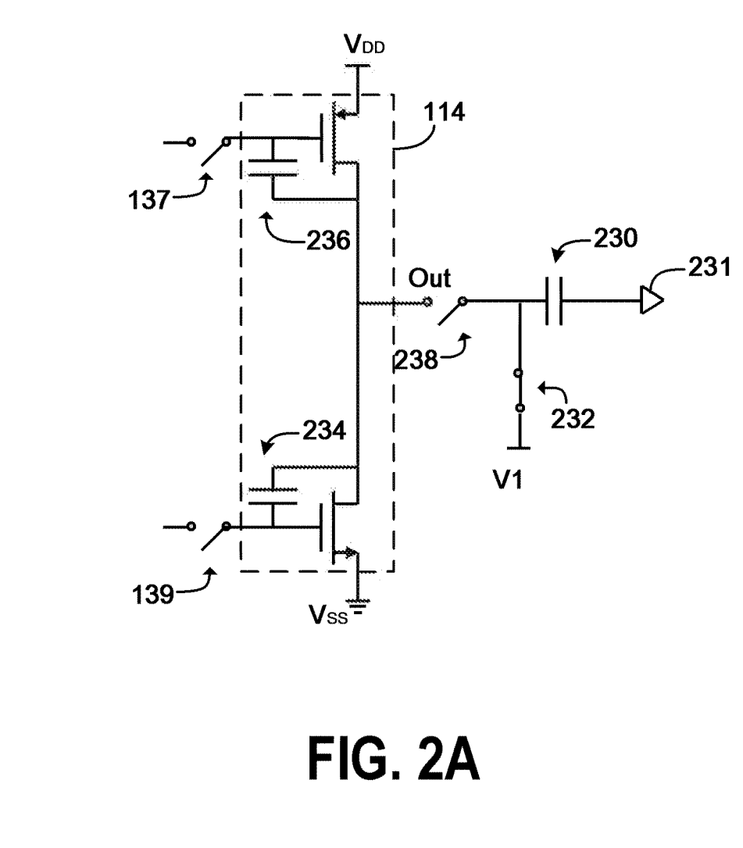
FIG. 2A is a schematic diagram illustrating one operational phase of an example output stage of an amplifier in accordance with one embodiment.
Figure 2B:
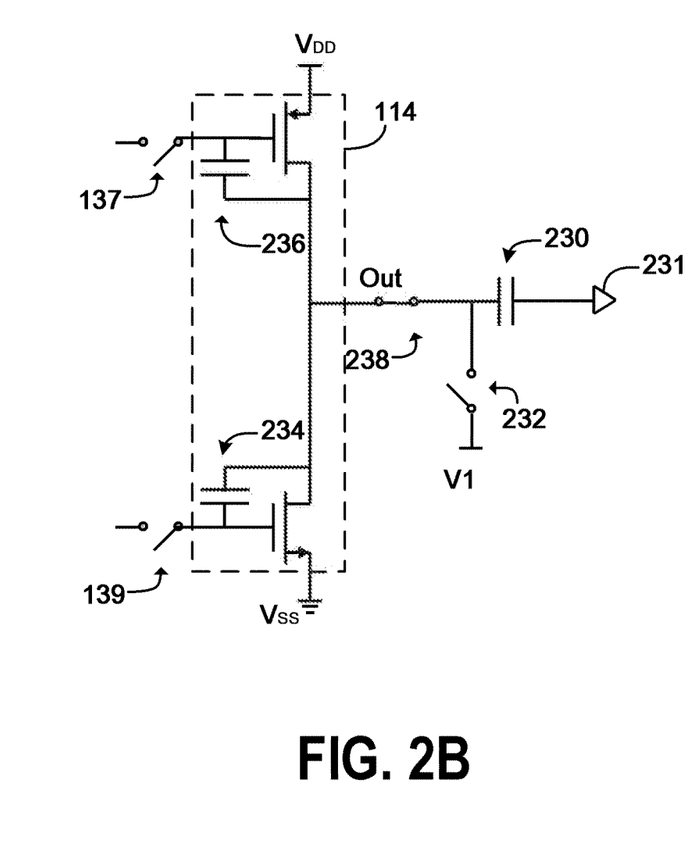
FIG. 2B is a schematic diagram illustrating another operational phase of an example output stage of an amplifier in accordance with one embodiment.

FIG. 2A is a schematic diagram illustrating one operational phase of an example output stage of an amplifier in accordance with one embodiment. FIGS. 2A-2B illustrate different operational phases of charging a switched capacitive load connected to the output stage 114. The operational phases of the circuits partially illustrated in FIGS. 2A-2B are further discussed below in connection with FIG. 4A. The illustration in FIG. 2A includes some of the same features discussed in connection with FIGS. 1A-1C above as indicated with the same numberings. FIG. 2A further illustrates compensation capacitors 234, 236, capacitive load switches 232, 238, and a first capacitive load 230. In some embodiments, the compensation capacitors 234, 236 can be considered to be Miller capacitors. In certain embodiments, there are no storage capacitors in the output stage 114 other than the compensation capacitors 234, 236. For example, in certain embodiments, there are no capacitors from nodes of the output stage 114 to ground. In addition, these compensation capacitors 234, 236 correspond to deliberately added capacitors and are not merely parasitic capacitance. FIG. 2A further illustrates node 231, which represents a node within the switching circuit (e.g., sigma-delta or SAR ADC) following the output stage 114 of the amplifier 100 (FIGS. 1A-1E). The node 231 can be at a fixed DC voltage that may or may not be ground, for example.

FIG. 2B is a schematic diagram illustrating another operational phase of an example output stage of an amplifier in accordance with one embodiment. The illustration in FIG. 2B includes some of the same features discussed in connection with FIGS. 1A-2A above as indicated with the same numberings.

Figure 4A:
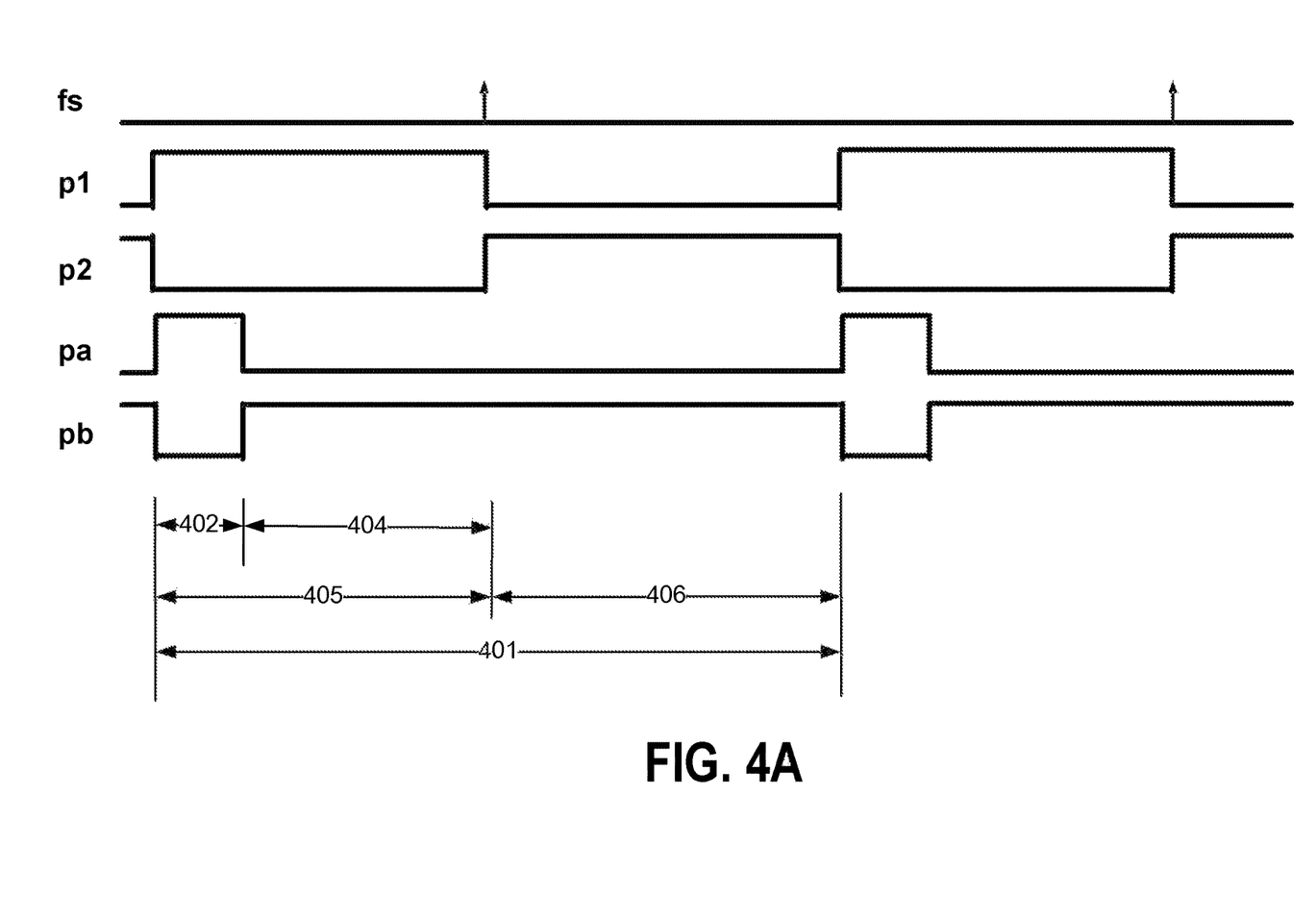
FIG. 4A is a timing diagram illustrating example operational phases in accordance with one embodiment.
Figure 4B:
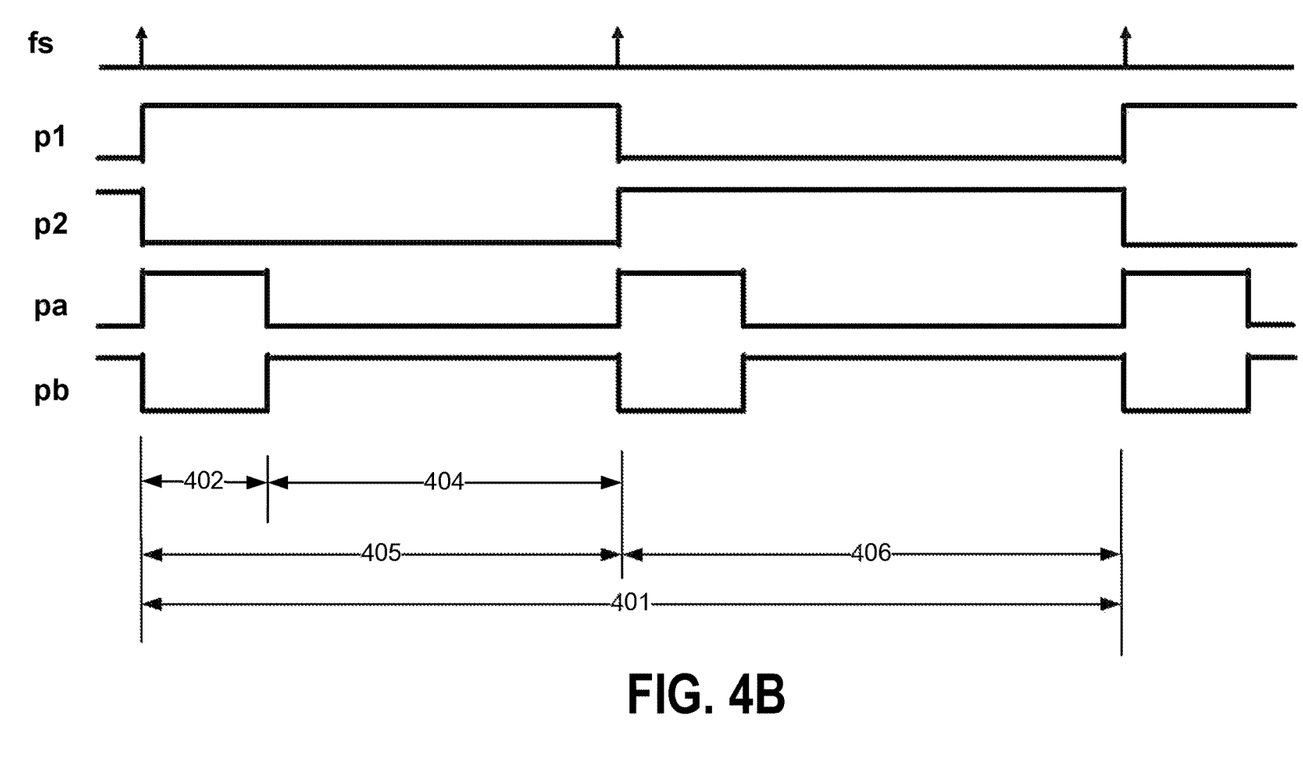
FIG. 4B is a timing diagram illustrating example operational phases in accordance with another embodiment.
Figure 4C:
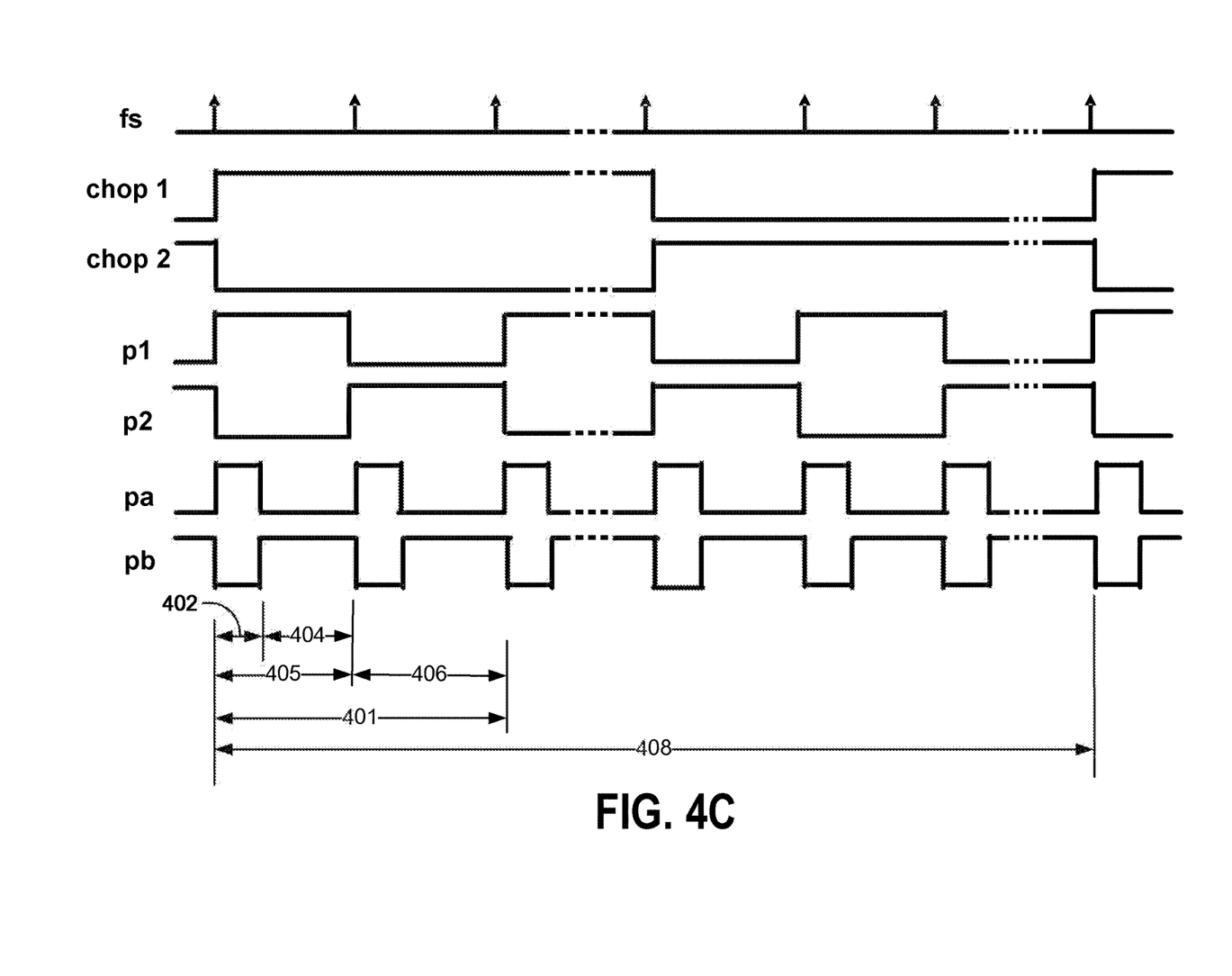
FIG. 4C is a timing diagram illustrating example operational phases in accordance with another embodiment.

In certain embodiments (e.g., double sampling or ping-pong scheme implementations), immediately before the precharging phase 402, sampling (e.g., fs of FIGS. 4B-4C) may take place. In other embodiments, after the fine settling phase 404 (FIG. 4A) there may be an idle period, which may coincide with the second switching phase 406, and the switching capacitive load may be disconnected from the amplifier during the idle period. In such embodiments, sampling (e.g., fs of FIG. 4A) may take place after the fine settling phase 404 (FIG. 4A) but not immediately before the next precharging phase 402 (FIG. 4A). In either case (FIG. 4A-4C), from the operation immediately preceding the end of the previous fine settling phase 404, the desired output voltage can be stored in the compensation capacitors 234, 236 across the drains and gates of the devices in the output stage 114. At the beginning of the precharging phase 402 (FIGS. 4B-4C) or at the end of the fine settling phase 404 (FIGS. 4A-4C), the output switches 137, 139 or one or more switches of the output choppers 136, 138 (FIGS. 1D-1E) are open to disconnect the output stage 114a-114e from the first or pre-output stage (e.g., input and amplifier stage 112) of the amplifier 100a-100e. As illustrated in FIG. 2A, at this point, the switched capacitive load 230 is at voltage V1, from a previous switching operation (e.g., a second switch phase 406 of FIG. 4A) of the circuit (e.g., sigma-delta or SAR ADC) following the output stage 114. In some embodiments, the precharging phase 402 can be synchronized to the switching phases 405, 406 (FIGS. 4A-4C). As further discussed in connection with FIG. 4C, in some embodiments, the amplifier 100 (FIGS. 1A-1E) can be a chopping amplifier, and its chopping period can be synchronized with and/or be integer multiples of the switching periods of the signals p1 and p2. As illustrated in FIG. 2B, at the beginning of the first switch phase 405, which may partially overlap with the precharge phase 402, the capacitive load switch 238 can be connected to the output of the amplifier 100a-100e. In some embodiments, the voltage V1 during the precharging phase is different from the desired output voltage, which can trigger an AC coupled feedback through the compensation capacitors 234, 236. The compensation capacitors 234, 236 then can bring back the output voltage as they have stored the desired output voltage immediately before the precharging and first switching phases 402, 405 or at the end of the fine settling phase 404. The voltage V1 can be provided by a voltage source or a voltage reference. For example, the voltage V1 can be selected to be about midway in the input voltage range of the corresponding analog-to-digital converter. In embodiments having a fully differential switching or sampling circuit (e.g., sigma-delta or SAR ADC) following the output stage 114, the voltage V1 can be the second input of the two differential inputs of the switching circuit.

In some embodiments, during the precharging phase 402 (FIGS. 4A-4C), the first stage of the amplifier 100a-100e (e.g. the amplifier stage 112 and/or the input differential pairs 104, 106) may stay idle or perform other functions, such as autozero. For example, in embodiments including autozero circuits (not shown) in conjunction with or instead of the biasing current sources 110, 111, 113, 117 (FIGS. 1A-1E), autozeroing can be performed during at least one of the precharging phases (e.g., 402 of FIGS. 4A-4C) controlled by pa, pb (FIGS. 4A-4C). As disclosed herein, in some embodiments the amplifier 100a-100e can be a two-stage amplifier with the second or output stage being a Miller compensated class AB output stage (e.g., the output stage 114a-114e), and this output stage can precharge one or more switched capacitive loads (e.g., 230, 235 in FIGS. 2A-3B) while the first stage stays idle or performs other functions such as autozero.

During the fine settling phase 404 (FIGS. 4A-4C), the first stage of the amplifier 100a-100e may be reconnected to the output stage 114a-114e with the output switches 137, 139 or one or more switches of the output choppers 136, 138. As disclosed herein, in some embodiments, the output stage 114 can provide most of the capacitive load charging used in the precharging phase 402, and then the internal nodes of the amplifier 100a-100e can be settled to their final values and be ready to provide final small signal settling. At the end of the fine settling phase 404, the capacitive load voltage is settled after the precharge by the output stage 114 as disclosed herein, and sampling may take place with the circuit connected to the output of the amplifier 100a-100e. In some embodiments, fewer phases or additional phases can be implemented depending on the sampling frequency and period. For example, in some embodiments, the first and second switching phases 405, 406, each of which is about one half of a switching period 401 controlled by p1, p2, can include both the precharging phase 402 and the fine settling phase 404 as discussed in connection with FIGS. 3A-3B and 4B below.

Figure 3A:
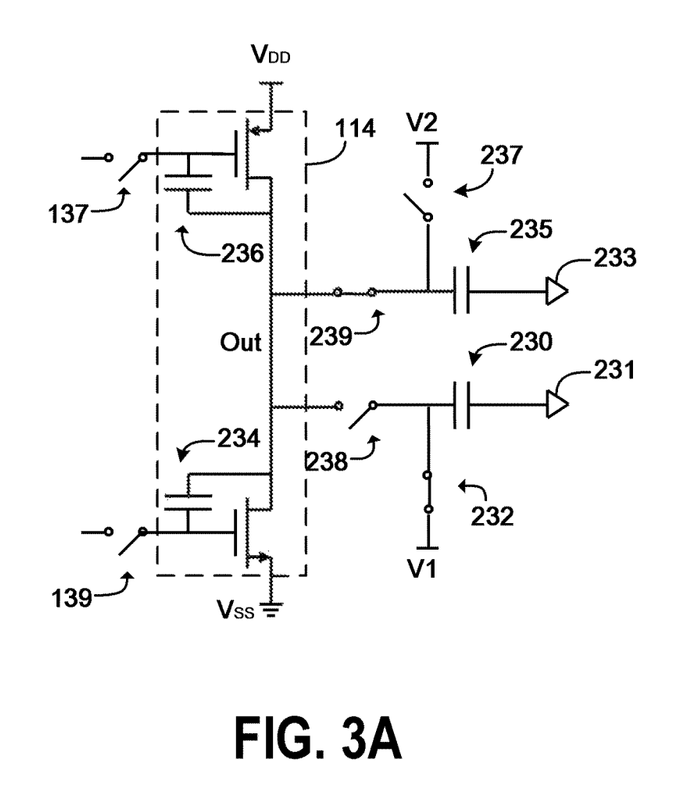
FIG. 3A is a schematic diagram illustrating one operational phase of an example output stage of an amplifier with another embodiment.
Figure 3B:
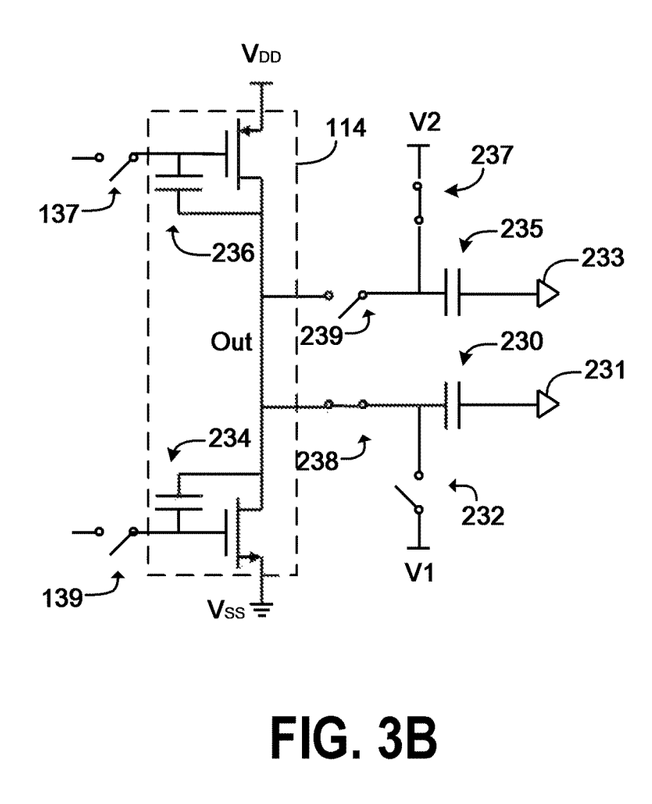
FIG. 3B is a schematic diagram illustrating another operational phase of an example output stage of an amplifier in accordance with another embodiment.

FIG. 3A is a schematic diagram illustrating one operational phase of an example output stage of an amplifier in accordance with another embodiment. FIGS. 3A-3B illustrate different operational phases of charging switched capacitive loads connected to the output stage 114. The operational phases of the circuits partially illustrated in FIGS. 3A-3B are further discussed below in connection with FIG. 4B. The illustration in FIG. 3A includes some of the same features discussed in connection with FIGS. 1A-2B above as indicated with the same numberings. FIG. 3A further includes a second capacitive load 235 and load switches 237, 239. In some embodiments, the first and second capacitive loads 230, 235 can be differential inputs to a switching circuit following the amplifier 100a-100e. FIG. 3A further illustrates node 233, which represents a node within the switching circuit (e.g., sigma-delta or SAR ADC) following the output stage 114 of the amplifier 100 (FIGS. 1A-1E). Similar to the node 231, the node 233 can be at a fixed DC voltage that may or may not be ground, for example.

FIG. 3B is a schematic diagram illustrating another operational phase of an example output stage of an amplifier in accordance with another embodiment. The illustration in FIG. 3B includes some of the same features discussed in connection with FIGS. 1A-3A above as indicated with the same numberings. As illustrated in FIG. 4B, the precharging and fine settling phases 402, 404 can be implemented over each of the first and second switch phases 405, 406, which are half of the switching period 401. In such embodiments, the first and second capacitive loads 230, 235 of FIGS. 3A-3B can be precharged with the output stage 114 in each of the first and second switch phases 405, 406.

In some embodiments, the switched capacitive loads 230, 235 which are illustrated with representative capacitors in FIGS. 2A-3B, can be sigma-delta modulator input capacitors or SAR ADC input capacitors connected to the output stage 114 of the amplifier 100a-100e (FIGS. 1A-1E). It can be advantageous to implement the precharging and fine settling phases as disclosed herein as the amplifier (e.g., the amplifier 100a-100e of FIGS. 1A-1E) can charge such capacitive load in a given period of time (e.g., sampling period) with a certain suitable level of accuracy.

FIG. 4A is a timing diagram illustrating example operational phases in accordance with one embodiment. The diagram in FIG. 4A illustrates sampling points fs, switching signals p1, p2, a precharging signal pa, and a fine settling signal pb. The states of the switching signals p1, p2 determine a switching period 401, a first switch phase 405, and a second switch phase 406. The periods of the sampling points fs determines sampling periods. In this example, a high state of the precharging signal pa determines the precharging phase 402, and a high state of the fine settling signal pb determines the fine settling phase 404. The precharging signal pa may be provided as a control to the switches 101, 127 and the input chopper 102 of FIGS. 1A-1E, and the fine settling signal pb may be provided as a control to the switches 103, 137, 139 and the output choppers 136, 138 of FIGS. 1A-3B. The first switching signal p1 may be provided as a control to the load switches 237, 238 of FIGS. 2A-3B, and the second switching signal p2 may be provided as a control to the switches 232, 239 of FIGS. 2A-3B. Also, in an embodiment with a sampling stage following the amplifiers 100a, 100b, and 100c, the sampling may be taken at near the end of the fine settling period 404 as illustrated in FIG. 4A, and the duration of the precharging phase 402 and the fine settling phase 404 can be based on the sampling period. In the illustrated example of FIG. 4A, the sampling period is the same as the switching period 401. The fine settling phase 404, which follows the precharging phase 402, lasts over the entire remaining duration of the switching phase 405. As further illustrated in FIGS. 4B-4C, the switching, sampling, and precharging period/frequency may vary relative to one another in other embodiments.

FIG. 4B is a timing diagram illustrating example operational phases in accordance with another embodiment. Similar to FIG. 4A, the switching signals p1, p2, the precharging signal pa, the fine settling signal pb and the sampling points fs, are illustrated in FIG. 4B. In the illustrated example of FIG. 4B, the sampling period is half of the switching period 401, and as discussed in connection with FIGS. 3A-3B above, the output stage 114 can be configured to precharge two switched capacitive loads (e.g., 230, 235 of FIG. 3) allowing fine settling of the amplifier 100a-100e during the first and second switch phases 405, 406 respectively.

FIG. 4C is a timing diagram illustrating example operational phases in accordance with another embodiment. Similar to FIGS. 4A-4B, the switching signals p1, p2, the precharging signal pa, the fine settling signal pb and the sampling points fs, are illustrated in FIG. 4C. FIG. 4C also illustrates chop 1 and chop 2 signals representing chopping signals of the amplifier 100 in case the amplifier 100 is implemented with a chopping amplifier. In embodiments including a chopping amplifier, the precharging features disclosed herein can be implemented with a switching frequency greater than or equal to a chopping frequency. In embodiments including autozero functions during one of the phases disclosed herein, a switching frequency can be greater than or equal to an autozero frequency. Accordingly, as illustrated in FIG. 4C, in some embodiments there can be multiple cycles of sampling, precharging, and fine settling within one switching period 401, and there can be multiple cycles of switching within one chopping period 408. In embodiments including autozero functions, there can be multiple cycles of switching within one autozero period, which may coincide with the chopping period 408.

The durations of the periods illustrated in FIGS. 4A-4C may be determined based on multiple factors such as the ADC sampling frequency, the ADC output data rate, or the amplifier flicker noise. For example, an embodiment (e.g., FIG. 4B) with an amplifier with a switching frequency of about 200 kHz and a sampling frequency of about 400 kHz may have a switching period 401 of about 5 µs, a sampling period of about 2.5 µs, a fine settling period 404 of about 1.875 µs, and the duration of the precharging period 402 of about 625 ns.

Figure 5:
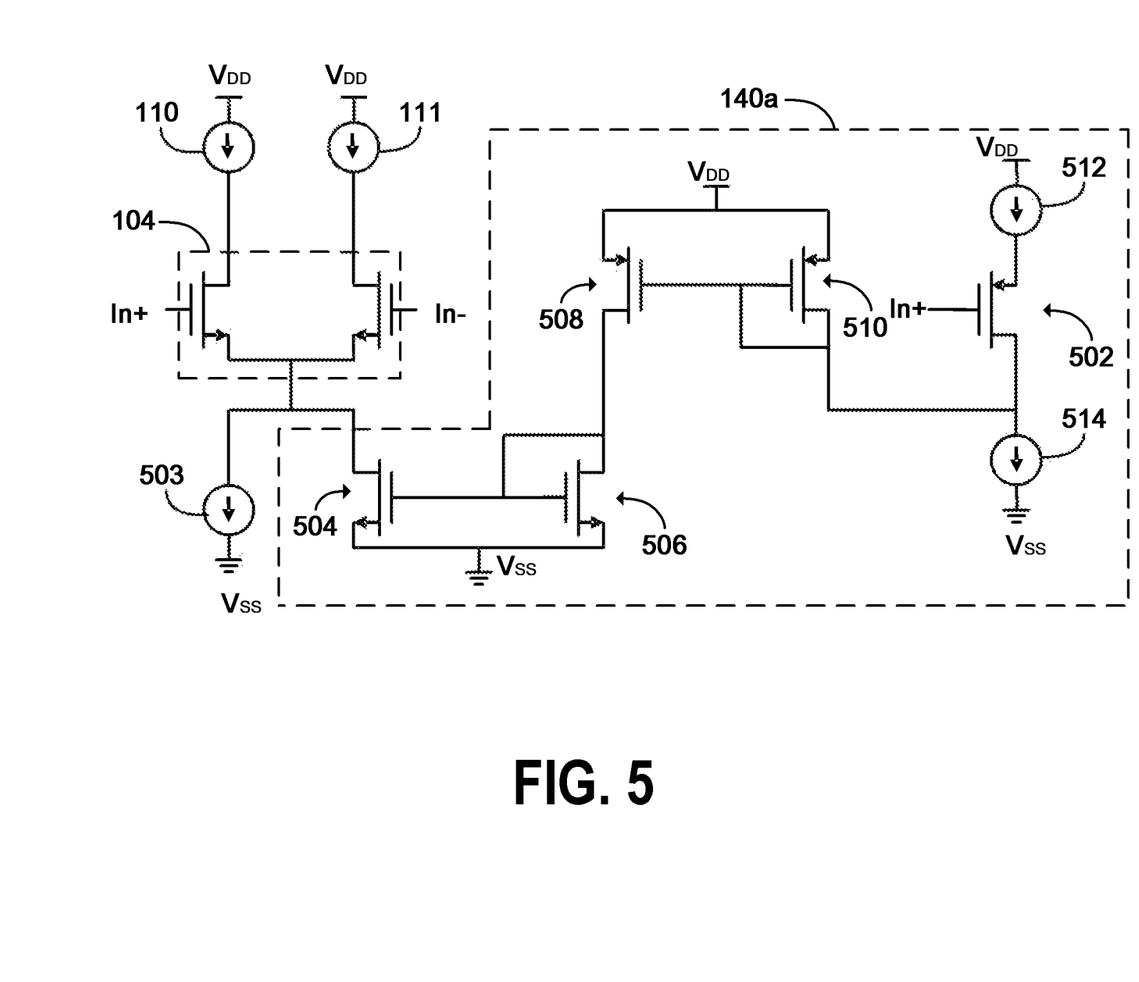
FIG. 5 is a schematic diagram illustrating an example transconductance stabilization circuit in accordance with one embodiment.

FIG. 5 is a schematic diagram illustrating an example transconductance stabilization circuit in accordance with one embodiment. FIG. 5 illustrates parts of the amplifier 100d-100e (FIGS. 1D-1E) in detail, including the biasing current sources 110, 111, the input differential pair 104, and a partial implementation of the transconductance stabilizer 140 of FIGS. 1D-1E. The transconductance stabilizer 140 of FIGS. 1D-1E may include stabilizing circuits for both of the input differential pairs 104 and 106 (FIGS. 1D-1E). In FIG. 5, an example stabilizing circuit for the input differential pair 104 is illustrated. The transconductance stabilizer 140a for the input differential pair 104 can be implemented using a replica device to sense the input voltage, and the transconductance stabilizer 140a may include current mirror transistors 504, 506, 508, and 510, an input pair replica device 502, and current sources 503, 512, and 514. For example, the input differential pair tail current source 150 (FIGS. 1D-1E) can be implemented by the current source 503 and the current mirror transistor 504. As illustrated in FIG. 5, the input pair replica device 502 may be a device that is complementary (e.g., PMOS) to the devices of the N-type input differential pair 104 (e.g., NMOS). The input pair replica device 502 may accept the signal at the non-inverting input node In+ as illustrated in FIG. 5. In one embodiment, the current sources 512 and 514 can source and sink about equal amounts of current, the current mirror transistors 504, 506, can be about equally sized, and the current mirror transistors 508, 510 can be equally sized.

During certain operating conditions, the biasing current from the input differential pair 104 may be equally shared between the current source 503 and the current mirror transistor 504 for the boosted case, but other configurations are possible. The current source 503 provides a normal amount of tail current for biasing, and the current mirror transistor 504 can provide a boost for transconductance $g_m$ stabilization. When both of the complementary input differential pairs 104, 106 (FIGS. 1D-1E) are connected in the continuous pair selection configuration or mode, the overall transconductance $g_m$ can be the sum of the two transconductances. However, the tail currents for the complementary input differential pairs 104, 106 can become squeezed due to lack of headroom when operating near rail voltages, resulting in loss of transconductance. For example, the N-type input differential pair 104 can become squeezed with input voltages near to $V_{SS}$. Similarly, the P-type input differential pair 106 can become squeezed with input voltages near to $V_{DD}$. So, for example, with an input voltage at the non-inverting input node In+ near to $V_{DD}$, the P-type input differential pair 106 becomes squeezed and loses transconductance. At the same time, the replica transistor 502 squeezes the current source 512, which reduces current flow from the replica transistor 502 that is sunk by the current source 514, which forces more current to flow through the diode-connected transistor 510. This increases the flow through the mirror transistor 508, which increases the flow through the diode-connected transistor 506, which increases the flow through the mirror transistor 504, which boosts the tail current of the N-type input differential pair 104, which results in relatively constant transconductance with input voltages near $V_{DD}$.

Similar to how the transconductance stabilizer 140a for the input differential pair 104 can be implemented as illustrated in FIG. 5, a transconductance stabilizer for the P-type input differential pair 106 (FIGS. 1D-1E) can be implemented using devices complementary to the ones used in the transconductance stabilizer 140a. For example, a transconductance stabilizer for the input differential pair 106 (FIGS. 1D-1E) may use an NMOS device as an input pair replica device, accepting the non-inverting input In+ (FIGS. 1D-1E). Having a complementary stabilizer circuit as described above may allow an overlap of transconductance ($g_m$), which may maintain the total transconductance relatively constant, which helps to prevent loss of bandwidth.

With the transconductance stabilizer 140 (FIGS. 1D-1E) implemented as partially illustrated in FIG. 5, the disclosure herein can boost tail current to keep constant total transconductance ($g_m$) over the full input range. For example, when the input differential pair tail current source 152 (FIGS. 1D-1E) is squeezed, the transconductance stabilizer 140a may be used to boost the current through the input differential pair tail current source 150 (FIGS. 1D-1E).

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure such as base stations, automotive electronics, industrial electronics, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a wrist watch, a clock, etc. Further, the electronic device can include unfinished products.

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other apparatus, not necessarily the apparatus described above. The elements and acts of the various embodiments described above can be combined to provide further embodiments.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An apparatus for pre-charging, the apparatus comprising:
    an output stage of an amplifier comprising:
        a first transistor;
        a second transistor;
        a first output node connected to the first and second transistors; and
    at least one compensation capacitor; and
    one or more output stage switches configured to connect or disconnect at least part of the output stage from an earlier stage of the amplifier, wherein the earlier stage comprises an amplifying stage being earlier in a signal path than the output stage,
    wherein the at least part of the output stage is configured to precharge at least one switched capacitive load substantially while the at least part of the output stage is disconnected from the earlier stage.

2. The apparatus of claim 1, wherein the at least part of the output stage is configured to precharge the at least one switched capacitive load for a first precharging duration within a first switch phase of the at least one switched capacitive load.

3. The apparatus of claim 2, wherein the at least part of the output stage is configured to precharge the at least one switched capacitive load for a second precharging duration within a second switch phase of the at least one switched capacitive load.

4. The apparatus of claim 1, wherein the at least one switched capacitive load is an input capacitor of an analog-to-digital converter (ADC).

5. The apparatus of claim 1, wherein the earlier stage of the amplifier is configured to autozero when the output stage of the amplifier precharges the at least one switched capacitive load.

6. The apparatus of claim 1, wherein the at least one compensation capacitor is arranged as a Miller capacitor.

7. The apparatus of claim 1, wherein the output stage of the amplifier further comprises:
    a third transistor;
    a fourth transistor; and
    a second output node connected to the third and fourth transistors.

8. The apparatus of claim 7, wherein the at least part of the output stage is configured to precharge two switched capacitive loads substantially during the at least part of the output stage is disconnected from the earlier stage.

9. The apparatus of claim 7, wherein at least part of the output stage is always connected to the earlier stage.

10. The apparatus of claim 7, wherein the second output node is further connected to an input of the amplifier.

11. The apparatus of claim 9, wherein the at least part of the output stage is configured to precharge two switched capacitive loads substantially during the at least part of the output stage is disconnected from the earlier stage.

12. A method of precharging at least one switched capacitive load connected to at least one output of an amplifier, the method comprising:
    disconnecting at least part of an output stage of the amplifier from an earlier stage of the amplifier for a first precharging duration within a first switch phase of the at least one switched capacitive load, wherein the earlier stage comprises an amplifying stage;
    connecting an output node of the amplifier to the at least one switched capacitive load for the duration of the first switch phase of the at least one switched capacitive load; and
    reconnecting the output stage of the amplifier to the earlier stage of the amplifier for a first fine settling duration after the first precharging duration,
    wherein the output stage comprises a first transistor and a second transistor and is compensated with at least one capacitor.

13. The method of claim 12, further comprising:
    disconnecting the at least part of the output stage of the amplifier from the earlier stage of the amplifier for a second precharging duration after the first fine settling duration within a second switch phase of the at least one switched capacitive load;

disconnecting the output of the amplifier from the at least one switched capacitive load for the duration of the second switch phase of the at least one switched capacitive load;

connecting the output of the amplifier to another at least one switched capacitive load for the duration of the second switch phase of the at least one switched capacitive load; and reconnecting the output stage of the amplifier to the first earlier stage of the amplifier for a second fine settling duration after the second precharging duration.

14. The method of claim 12, further comprising autozeroing the earlier stage of the amplifier for the first precharging duration.

15. The method of claim 12, wherein the at least one capacitor is arranged as a Miller capacitor.

* * * * *